United States Patent
Kaneko et al.

(10) Patent No.: US 7,323,943 B2
(45) Date of Patent: Jan. 29, 2008

(54) PLL CIRCUIT WITH DEADLOCK DETECTION CIRCUIT

(75) Inventors: Makoto Kaneko, Kanagawa (JP); Satoshi Nakamura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 61 days.

(21) Appl. No.: 11/280,169

(22) Filed: Nov. 17, 2005

(65) Prior Publication Data
US 2006/0114067 A1    Jun. 1, 2006

(30) Foreign Application Priority Data
Nov. 30, 2004   (JP)   ............... 2004-346660

(51) Int. Cl.
*H03L 7/00* (2006.01)
(52) U.S. Cl. ..................... 331/12; 331/16
(58) Field of Classification Search ............ 331/16, 331/12
See application file for complete search history.

(56) References Cited

U.S. PATENT DOCUMENTS 3,659,286 A * 4/1972 Perkins et al. ............ 341/70
5,220,293 A * 6/1993 Rogers ..................... 331/15
5,389,898 A * 2/1995 Taketoshi et al. .......... 331/2
5,864,572 A   1/1999 Bhagwan
6,700,943 B1 * 3/2004 Miller ..................... 375/354

FOREIGN PATENT DOCUMENTS

JP   60-247330   12/1985
JP   11-103249    4/1999

OTHER PUBLICATIONS

European Search Report dated Feb. 2, 2006.

* cited by examiner

*Primary Examiner*—Robert Pascal
*Assistant Examiner*—Levi Gannon
(74) *Attorney, Agent, or Firm*—McGinn IP Law Group, PLLC

(57) ABSTRACT

Disclosed is a PLL circuit including a deadlock detection circuit includes a counter circuit for counting a clock signal. In a deadlock state, the deadlock detection circuit outputs a deadlock detection signal responsive to an output signal from the counter circuit when the counter circuit has counted a preset number of the clock signal. The deadlock detection signal serves to release the PLL circuit from the dead lock. During the normal operation, the counter circuit does not impart noise to the PLL circuit.

17 Claims, 8 Drawing Sheets

PLL CIRCUIT WITH DEADLOCK DETECTION CIRCUIT

FIELD OF THE INVENTION

This invention relates to a PLL circuit and, more particularly, to a PLL circuit having a deadlock removing circuit.

BACKGROUND OF THE INVENTION

FIG. 1 shows an illustrative configuration of a conventional PLL (Phase Locked Loop) circuit disclosed in Patent Publication 1. This conventional PLL circuit, shown in FIG. 1, includes a phase frequency detector (PFD) 11, a charge pump circuit (CP) 12, a low-pass filter (LPF) 13, a voltage-controlled oscillator (VCO) 14, and a divider circuit (DIV) 15. The phase frequency detector 11 compares the phase of rising of a reference clock signal (REFCLK) with that of a divided clock signal (DIVCLK), output from the divider circuit 15 and, if the divided clock signal lags or leads the reference clock signal, the phase frequency detector 11 outputs an up (UP) signal or a down (DN) signal, each being of a pulse width corresponding to the phase difference, respectively.

The charge pump circuit 12 receives UP and DN signals output from the phase frequency detector 11 and causes the current having a value corresponding to the pulse width of the UP signal to flow from a power supply to an output terminal thereof, thereby charging the output terminal, while causing the current having a value corresponding to the pulse width of the DN signal to flow from the output terminal to the ground, thereby discharging the output terminal. The charge pump circuit 12 outputs from the output terminal thereof an error signal corresponding to the phase/frequency difference detected by the phase frequency detector 11. The low-pass filter 13 receives the error signal output from the charge pump circuit 12 and generates a control voltage which is obtained by smoothing the error signal. The voltage-controlled oscillator 14 receives the control voltage output from the low-pass filter 13 and generates an output clock signal, the frequency of which is subjected to change to a higher value or to a lower value depending on a higher or lower value of the control voltage, respectively. The divider circuit 15 receives the output clock signal (VCOCLK) output from the voltage-controlled oscillator 14 and divides the output clock signal (VCOCLK) by a preset frequency division ratio to output the divided clock signal (DIVCLK). In this manner, the PLL circuit performs feedback control so that the reference clock signal (REFCLK) and the divided clock signal (DIVCLK) becomes coincident in phase and frequency with each other and hence the frequency of the output clock signal (VCOCLK) of the voltage-controlled oscillator 14 becomes a preset multiple of the frequency of the reference clock signal (REFCLK).

In unstable states, such as on power up, the oscillation frequency of the voltage-controlled oscillator 14 may become unusually high to exceed the limit of the toggle frequency of the divider circuit 15. In case the frequency of the output clock signal (VCOCLK) fed to the divider circuit 15 exceeds the maximum toggle frequency of the divider circuit 15, the divider circuit 15 continues to output a fixed level, as a result of which the phase frequency detector 11 continues to output the UP signal. This leads to a deadlock state in which the PLL circuit is unable to act as a negative feedback loop. In order to take a measure to meet the situation, the PLL circuit shown in FIG. 1 includes a deadlock detection circuit made up by a power-on reset circuit 25, a flip-flop 26, and an NMOS transistor 3. This deadlock detection circuit operates as follows:

First, until such time that the power supply voltage on power up reaches a preset value, an output signal of the power-on reset circuit 25 is activated to reset the divider circuit 15 as well as to set the flip-flop 26. An output of the flip-flop 26 turns the transistor 3 on to discharge an output of the low-pass filter 13.

Consequently, the voltage-controlled oscillator 14 oscillates at a low frequency without oscillating at an unusually high frequency. When the power supply voltage then reaches a preset value, an output signal of the power-on reset circuit 25 is inactivated to release the reset state of the divider circuit 15. The divider circuit 15 divides the frequency of the output of the voltage-controlled oscillator 14 to output the divided clock signal (DIVCLK). By the divided clock signal, the flip-flop 15 is reset to turn off the NMOS transistor 3. As from this time, the PLL circuit commences its normal operation.

[Patent Document 1]

JP Patent Kokai Publication No. JP-A-11-103249

SUMMARY OF THE DISCLOSURE

With the above-described conventional PLL circuit, it is possible to prevent the circuit from falling into a deadlock state in an unstable state prevailing at the time of power up. However, if, in the course of subsequent operation, the oscillation frequency of the voltage controlled oscillator becomes unusually high by some reason or other, or the oscillation of the voltage controlled oscillator is halted, such that the PLL circuit has fallen into a deadlock state, the PLL circuit cannot be restored to its normal state except if the power-on resetting circuit is again set into operation. It is therefore desirable that, when the PLL circuit has fallen into a deadlock state, the deadlock state can be automatically detected such that the PLL circuit can be automatically reverted to its normal operation.

In view of the above depicted status of the art, the present invention provides a PLL circuit comprising a phase frequency detector for comparing the phase or the frequency of a reference clock signal with the phase or the frequency of a divided clock signal to output an UP signal or a DN signal depending on whether the phase of the divided clock signal leads or lags the phase of the reference clock signal, respectively, or on whether the frequency of the divided clock signal is lower or higher than the frequency of the reference clock signal, respectively, a charge pump circuit for causing current to flow out to an output thereof and to flow in from the output thereof, responsive to the UP signal and to the DN signal, respectively, for generating an error signal associated with phase or frequency difference detected by said phase frequency detector, a low-pass filter for smoothing the error signal to output a control voltage, a voltage controlled oscillator for generating an output clock signal, the frequency of which is changed to a higher or lower value depending on the higher or lower value of the control voltage, a divider circuit for dividing the frequency of the output clock signal by a preset frequency division ratio to output the divided clock signal, and a deadlock detection circuit for detecting a deadlock state of the PLL circuit to output a deadlock detection signal. The deadlock detection circuit includes a counter circuit for counting a clock signal. The deadlock detection circuit outputs the deadlock detection signal responsive to a signal output when the counter circuit has counted a preset number of the clock signal in the deadlock state. The deadlock state is removed by the deadlock detection signal.

According to the present invention, a deadlock detection signal is output responsive to an output signal output when a preset number of clocks has been counted in a deadlock state by a counter circuit, and the deadlock state is removed by the deadlock detection signal, as a result of which, the deadlock state can be detected reliably to render it possible to release the PLL circuit automatically from the deadlock.

The meritorious effects of the present invention are summarized as follows.

The present invention provides a PLL circuit including a deadlock detection circuit enabling the PLL circuit to be freed automatically from the deadlock and which does not operate as a noise source otherwise affecting the PLL circuit during the normal operation.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
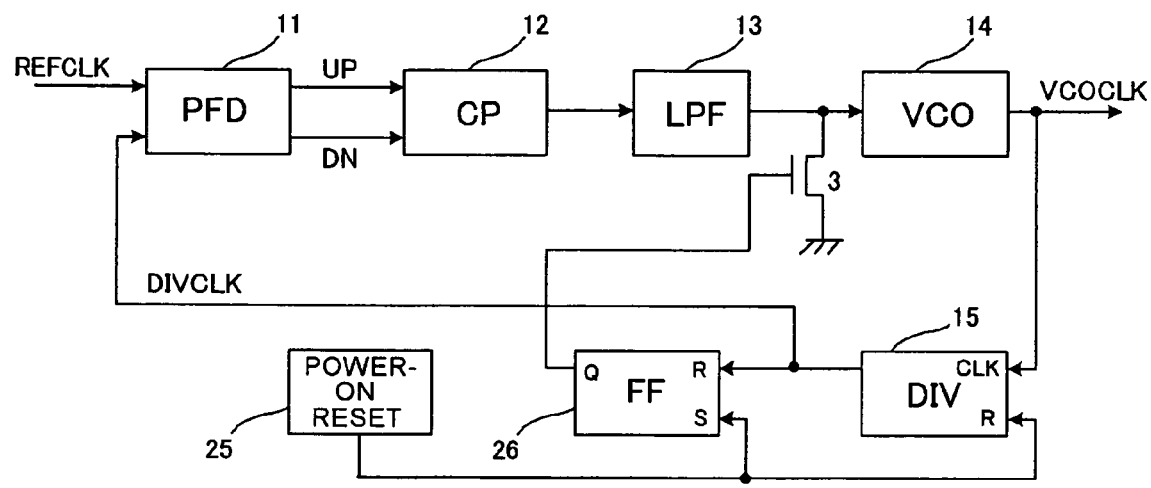
FIG. 1 is a diagram showing the configuration of a conventional PLL circuit.

Referring to the drawings, preferred embodiments of the PLL circuit of the present invention will be described in detail.

First Embodiment

Figure 2:
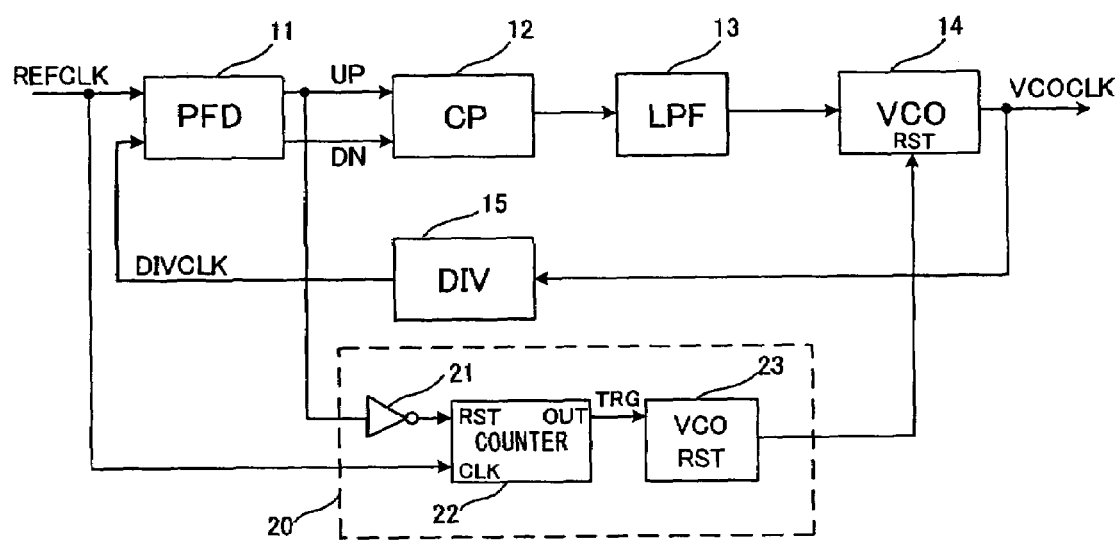
FIG. 2 is a diagram showing the configuration of a PLL circuit of the first embodiment of the present invention.

FIG. 2 is a block diagram showing the configuration of a PLL circuit according to an embodiment of the present invention. Referring to FIG. 2, the PLL circuit according to the present embodiment comprises a phase frequency detector (PFD) 11, a charge pump circuit (CP) 12, a low-pass filter (LPF) 13, a voltage-controlled oscillator (VCO) 14, a divider circuit (DIV) 15 and a deadlock detection circuit 20.

Of these, the phase frequency detector 11, the charge pump circuit 12, the low-pass filter 13, the voltage-controlled oscillator 14 and the divider circuit 15 are similar to the corresponding components of the conventional PLL circuit shown in FIG. 1.

Figure 3A:
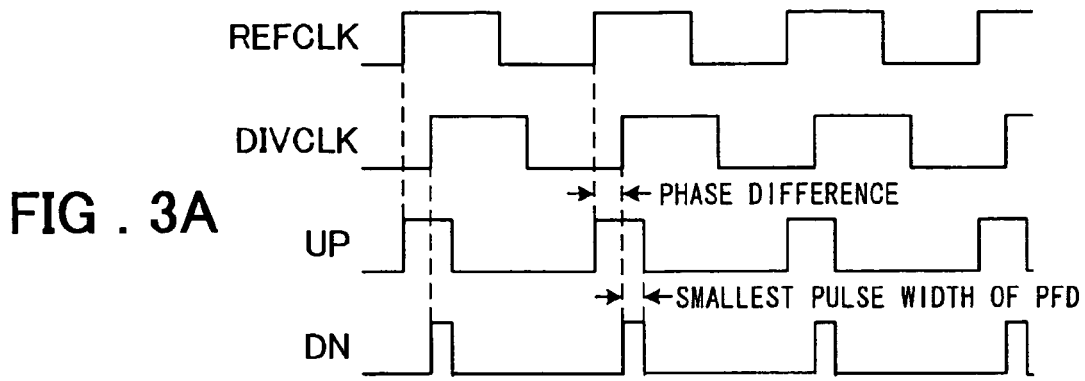
FIGS. 3A, 3B, 3C and 3D are timing charts showing the operation of the PLL circuit.
Figure 3B:
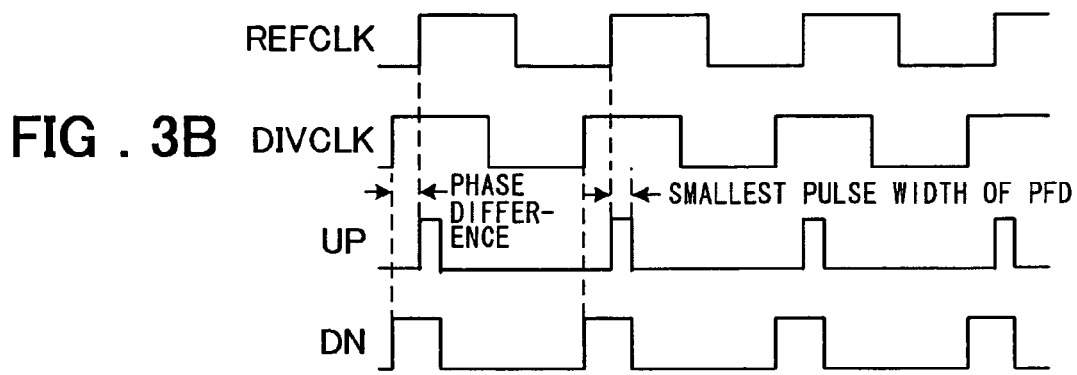

The phase frequency detector 11 compares the phase of a rising edge of a reference clock signal (REFCLK) with that of a divided clock signal (DIVCLK) output from the divider circuit 15. If the divided clock signal lags the reference clock signal, or is lower in frequency than the reference clock signal, the phase frequency detector 11 outputs an UP signal, which is a positive going pulse of a pulse width conforming to the phase difference, as shown in FIG. 3A. At this time, the DN signal is output as a positive going pulse of a minimum pulse width of the phase frequency detector 11. If the divided clock signal leads the reference clock signal, or is higher in frequency than the reference clock signal, the phase frequency detector 11 outputs a DN signal, which is a positive going pulse of a pulse width conforming to the phase difference, as shown in FIG. 3B. At this time, the UP signal is output as a positive going pulse of a minimum pulse width of the phase frequency detector 11.

Figure 3C:
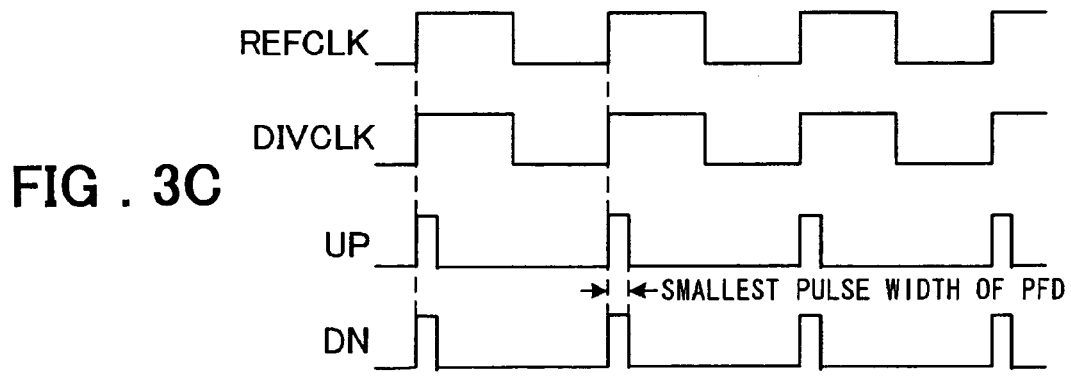

The charge pump circuit 12 causes the current of a current value corresponding to the pulse width of the UP signal to flow from a power supply to an output terminal, as an output error signal, while causing the current of a current value corresponding to the pulse width of the DN signal to flow from the output terminal to the ground, again as an output error signal. Thus, the output terminal voltage of the charge pump circuit 12 corresponds to the phase difference detected by the phase frequency detector. The low-pass filter 13 receives the error signal output from the charge pump circuit 12 and carries out smoothing of the error signal received to generate a control signal. The voltage-controlled oscillator 14 receives the control signal to generate an output clock signal, the frequency of which is varied to a higher or a lower value in dependence upon the higher or lower value of the control voltage, respectively. The divider circuit 15 receives the output clock signal from the voltage-controlled oscillator 14 and divides the output clock signal by a preset frequency division ratio to output the divided clock signal. In this manner, the PLL circuit performs feedback control to bring the reference clock signal and the divided clock signal into coincidence with each other in phase and frequency, so that the reference clock signal will be synchronized as to the phase with the divided clock signal. At this time, the DN signal and the UP signal are output as positive going pulses of the minimum pulse width of the phase frequency detector 11, as shown in FIG. 3C.

Figure 3D:
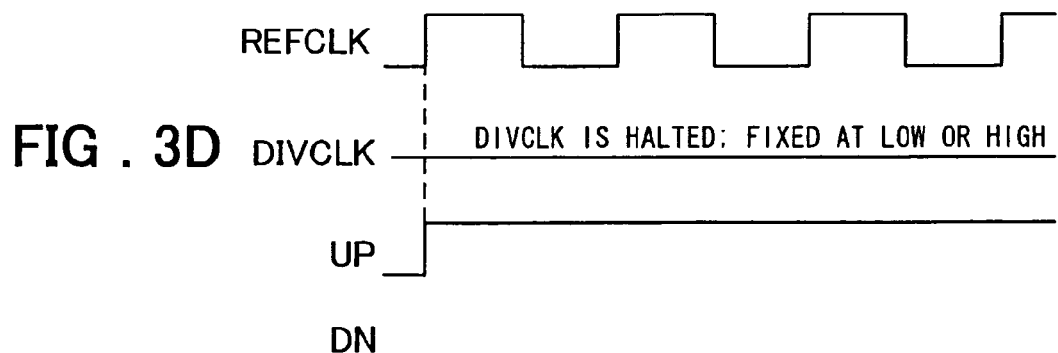

If the PLL circuit falls into a deadlock state by some or other reason, such as by cessation of oscillation of the voltage-controlled oscillator 14 or by unusual increase of the oscillation frequency, the divided clock signal output from the divider circuit 15 becomes fixed at a high or low level, while the UP signal and the DN signal are fixed at a high level and a low level, respectively, as shown in FIG. 3D.

The deadlock detection circuit 20 in the present embodiment comprises an inverter 21 which receives the UP signal from the phase frequency detector 11, a counter circuit 22 which receives the reference clock signal (REFCLK) and an output signal of the inverter 21 at its clock input terminal and at its reset terminal, respectively, to output a trigger output signal (TRIG), and a VCO resetting circuit 23 which receives the trigger output signal (TRIG) output from the counter circuit 22 and supplies a VCO resetting signal to an reset terminal of the voltage controlled oscillator 14.

Figure 4:
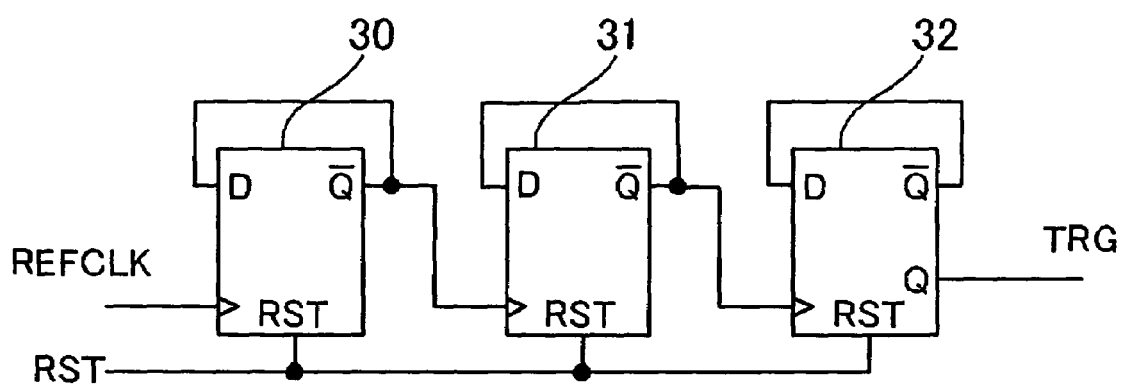
FIG. 4 is a diagram showing the configuration of a counter circuit in the PLL circuit of the present invention.

FIG. 4 shows an illustrative configuration of the counter circuit 22. Referring to FIG. 4, the counter circuit 22 is configured as a $2^3$ counter, composed by three D-flip-flops 30, 31 and 32. To D-input terminals of the D-flip-flops 30, 31 and 32 are connected to respective inverting output terminals (QB). To each of the reset input terminals (RST) of the D-flip-flops 30, 31 and 32 is supplied an inverted version of the UP signal from the inverter 21. The clock terminal of the D-flip-flop 30 is supplied with the reference clock (REFCLK). The inverting output (QB) of the D-flip-flop 30 is connected to the clock terminal of the D-flip-flop 31. The inverting output (QB) of the D-flip-flop 31 is connected to the clock terminal of the D-flip-flop 32. An output signal from the non-inverting output terminal (Q) of the D-flip-flop 32 is supplied, as the trigger output signal (TRG), to the VCO resetting circuit 23.

Figure 5:
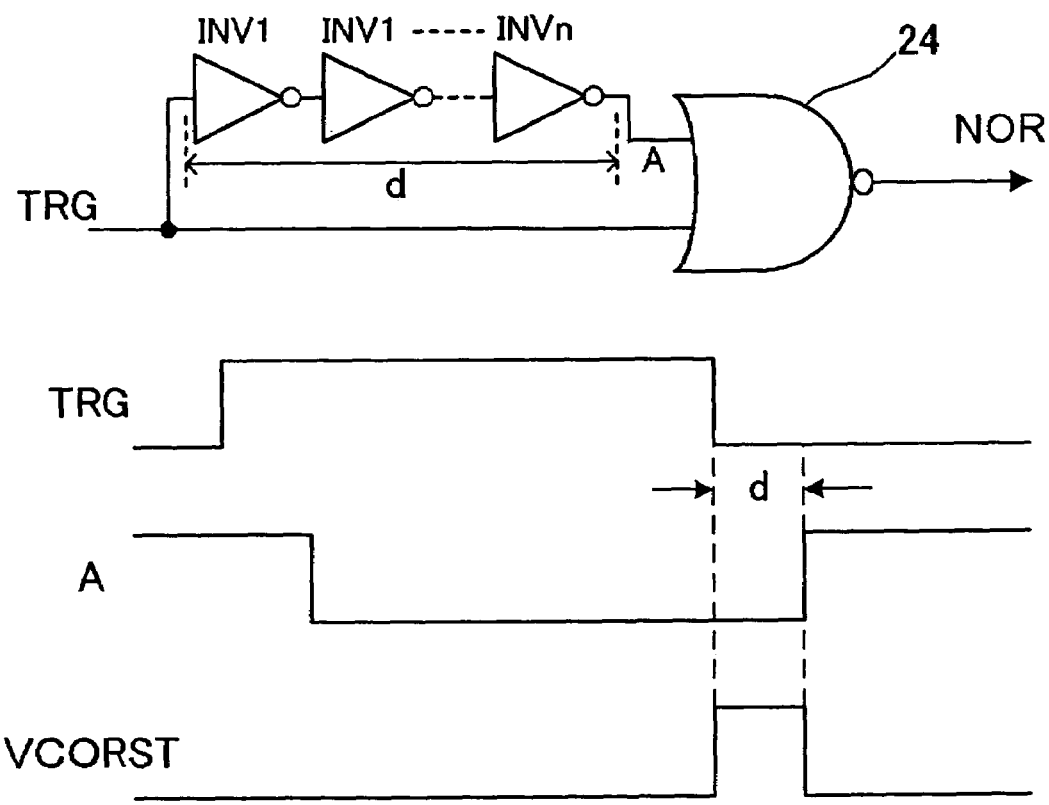
FIG. 5 is a diagram showing the configuration of a VCO resetting circuit in the PLL circuit of the present invention.

FIG. 5 shows an illustrative configuration of the VCO resetting circuit 23. Referring to FIG. 5, the VCO resetting circuit 23 comprises a delay circuit composed of an odd number of inverters (INV1 to INVn) and a NOR circuit 24. The NOR circuit 24 outputs an inverted logical sum of the trigger output (TRG) and a signal (A) corresponding to the trigger output (TRG) delayed by the delay circuit. The VCO resetting circuit 23 outputs a one shot pulse signal of a pulse width corresponding to the delay time (d) of the delay circuit, at the falling edge of the trigger output signal (TRG). A VCO resetting signal (VCORST) which is one shot pulse signal output from the VCO resetting circuit 23 is supplied as a deadlock detection signal, to a reset terminal of the voltage-controlled oscillator 14.

Figure 6:
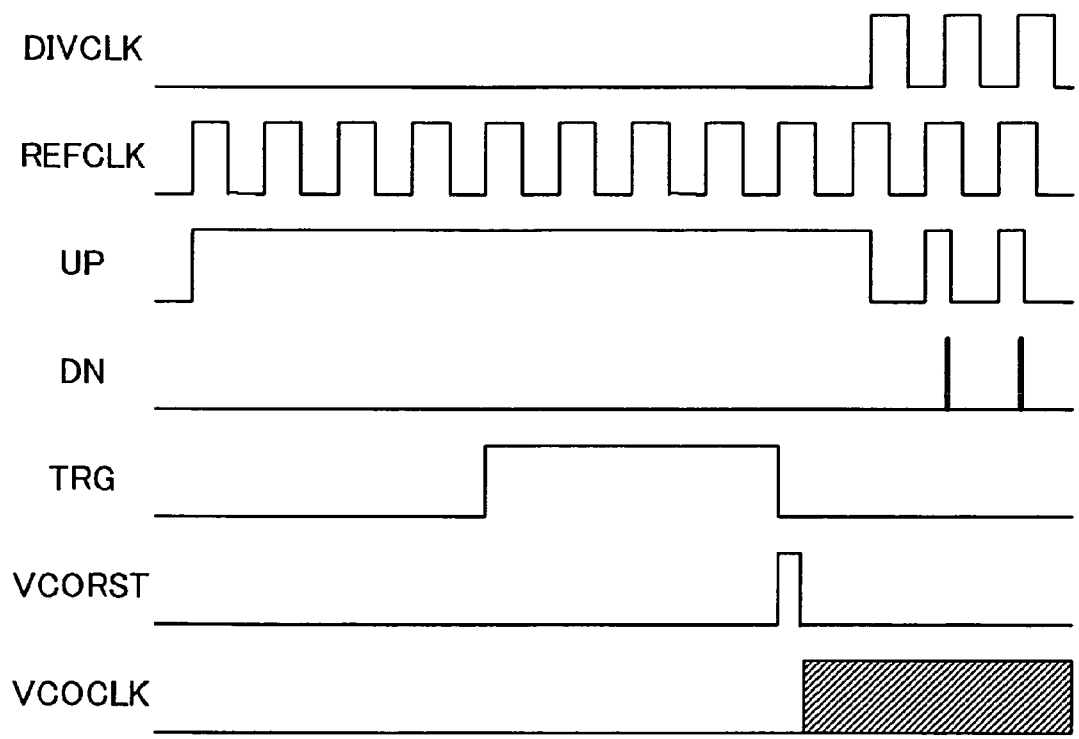
FIG. 6 is a timing chart at the time of deadlock in the PLL circuit of the present invention.

FIG. 6 is a timing chart showing the operation of the PLL circuit when the PLL circuit has fallen into the deadlock state. If, after phase synchronization of the reference clock signal with the divided clock signal, the PLL circuit falls into deadlock by some reason or other, the divided clock signal (DIVCLK) is at a fixed level. In FIG. 6, the divided clock signal (DIVCLK) is fixed at a low level.

When the divided clock signal (DIVCLK) has become fixed at a low level, the UP signal and the DN signal become fixed at a high level and in at a low level, respectively. The counter circuit 22, which has so far been reset every period of the divided clock signal (DIVCLK), by a signal (RST) which is obtained by inverting the UP signal by the inverter 21, commences to count the reference clock signal (REDCLK). When the count value of the reference clock signal (REDCLK) by the counter circuit 22 becomes $2^2$, the trigger output signal (TRIG) goes to a high level and when the count value of the reference clock signal (REDCLK) by the counter circuit 22 becomes $2^3$, the trigger output signal (TRIG) undergoes a transition from a high level to a low level. A VCO resetting signal (VCORST) is output from the VCO resetting circuit 23 at a falling edge of the trigger output signal (TRG) output from the counter circuit 22 which has counted a preset number, herein $2^3$, of the reference clock signal (REFCLK). The voltage-controlled oscillator 14, reset by the VCO resetting signal (VCORST), begins oscillation, and hence the PLL circuit is synchronized after a preset time interval.

Second Embodiment

Figure 7:
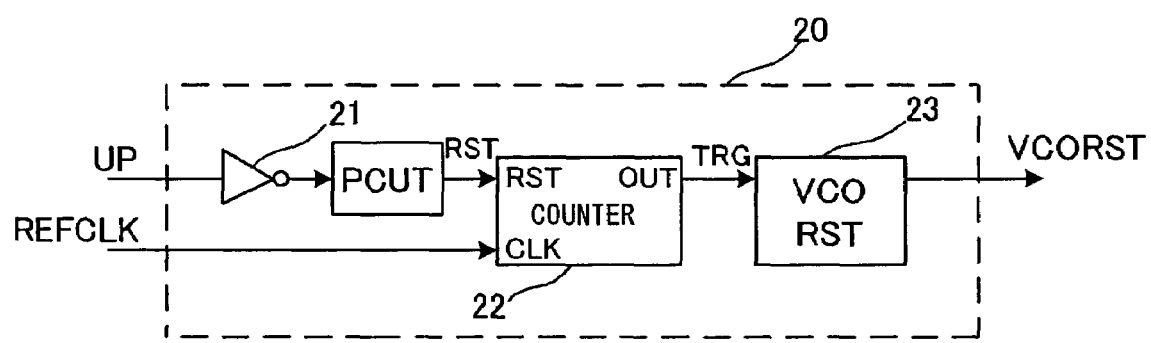
FIG. 7 is a diagram showing the configuration of a deadlock detection circuit of a second embodiment of the present invention.

FIG. 7 shows the configuration of the deadlock detection circuit 20 in the PLL circuit of a second embodiment of the present invention. The configuration of the deadlock detection circuit 20 according to the present second embodiment is equivalent to that of the deadlock detection circuit 20 of the first embodiment, except that, in the configuration of the second embodiment, there is newly added a pulse cutting circuit 24. The configuration of the present second embodiment is otherwise the same as that of the first embodiment described above.

Figure 8A:
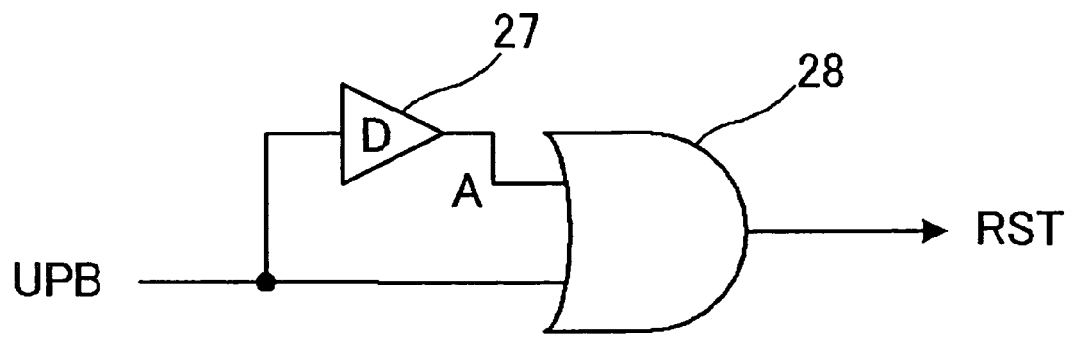
FIGS. 8A and 8B are diagrams showing the configurations and the operations of a pulse cutting circuit in the second embodiment of the present invention.

FIG. 8A shows the configuration of the pulse cutting circuit 24. This pulse cutting circuit 24 is supplied with an inverted version of the UP signal by the inverter 21 (UPB) to output a resetting signal (RST) to the counter circuit 22. The pulse cutting circuit 24 is made up by a delay circuit 27 and an OR circuit 28. The OR circuit 28 is supplied with a signal (UPB), which is an inverted version of the UP signal inverted by the inverter 21, and with a signal (A), which is obtained by delaying the UPB by the delay circuit 27 a preset delay time (D), to output a signal corresponding to the logical sum of these two signals.

Figure 8B:
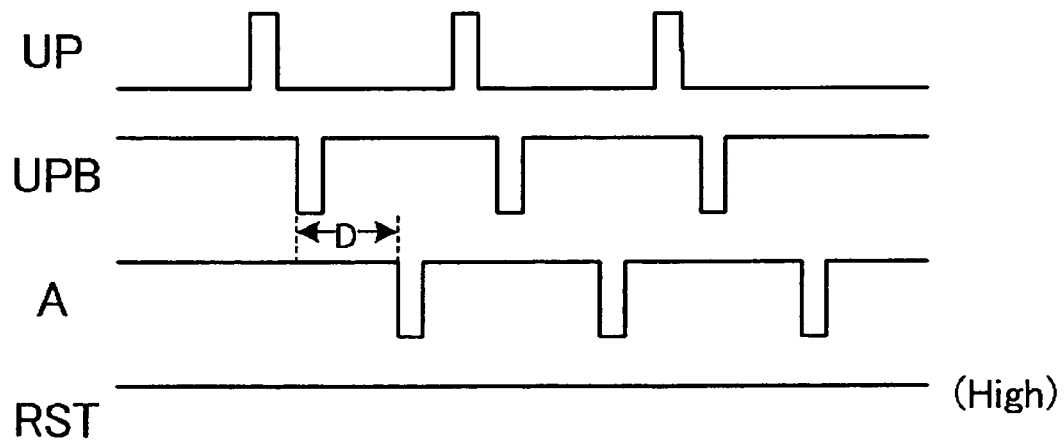

As will be apparent from the timing chart shown in FIG. 8B, the pulse cutting circuit 24 cuts a pulse having a pulse width not larger than D to output the resetting signal (RST) which is of a high level at all times. In the present second embodiment, the UP signal of the smallest pulse width, output from the phase frequency detector 11 during the normal operation of the PLL circuit, is cut by the pulse cutting circuit.

Thus, the counter circuit 22 is not reset every period of the reference clock signal (REFCLK) by the UP signal of the minimum pulse width, and is supplied at all times with the reset signal which then operates to halt the operation of the counter circuit 22. Thus, with the present second embodiment, there may be achieved such a meritorious effect that the operation noise of the counter circuit 22 is prevented from affecting the PLL circuit to affect in turn jitter of the output clock signal of the PLL circuit.

In the above-described first and second embodiments, the inverted version of the UP signal which is fixed at a high level at the time of deadlock, is used as the resetting signal (RST) for the counter circuit 22. Hence, during the normal operation, the counter circuit 22 is reset every period of the reference clock signal (REFCLK). However, comparable results may be obtained with use of the DN signal which becomes fixed at a low level at the time of deadlock. In this case, the counter circuit 22 is reset every period of a divided clock signal (DIVCLK). A logical sum signal of the above two signals also may be used as the resetting signal (RST). Although the counter circuit 22 is configured to count the reference clock signal (REFCLK), it is also possible to count such a signal, obtained on frequency division of the reference clock signal at a preset ratio. It is to be noted that any clock signal other than the reference clock signal may be used provided that the clock signal used are independent of output clocks of the PLL circuit, it being sufficient if the counter used is able to count during the time sufficiently allowing for deadlock decision in conjunction with the number of stages of the counter circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

The invention claimed is:

1. A PLL circuit comprising:
 a phase frequency detector, receiving a reference clock signal and a divided clock signal, for comparing phase or frequency of the reference clock signal with phase or frequency of the divided clock signal to output an up signal or a down signal depending on whether the phase of the divided clock signal leads or lags the phase of the reference clock signal, respectively, or on whether the frequency of the divided clock signal is lower or higher than the frequency of the reference clock signal, respectively;

a charge pump circuit, receiving the up and down signals, for causing current to flow out to an output thereof and to flow in from the output thereof, responsive to said up signal and to said down signal, respectively, for outputting an error signal associated with phase or frequency difference detected by said phase frequency detector;

a low-pass filter, receiving the error signal, for smoothing the error signal to output a control voltage;

a voltage controlled oscillator, receiving the control voltage for generating an output clock signal, the frequency of which is controlled to vary to a higher or lower value in accordance with higher or lower level of said control signal, respectively;

a divider circuit, receiving the output clock signal, for dividing the frequency of the output clock signal by a preset frequency division ratio to output said divided clock signal; and a deadlock detection circuit for detecting the falling of the PLL circuit into a deadlock state to output a deadlock detection signal;

said deadlock detection circuit including a counter circuit for counting a clock signal, said deadlock detection circuit outputting the deadlock detection signal responsive to a signal output from said counter circuit when said counter circuit has counted a preset number of said clock signal in the deadlock state, said deadlock state being removed by said deadlock detection signal and being detected by monitoring one of said up and down signals.

2. The PLL circuit according to claim 1, wherein said counter circuit is reset responsive to one of said up signal and said down signal.

3. The PLL circuit according to claim 2, further comprising a pulse cutting circuit for cutting one of said up signal and said down signal having a pulse width not larger than a preset width;

said counter circuit being reset responsive to an output signal of said pulse cutting circuit.

4. The PLL circuit according to claim 3, said pulse cutting circuit comprising an OR gate receiving as inputs an inverse of said one of said up signal and said down signal and said inverse of said one of said up signal and said down signal as delayed by a preset delay.

5. The PLL circuit according to claim 1, wherein said clock signal that said counter circuit counts is the reference clock signal or a signal obtained on frequency division of said reference clock signal by a preset frequency division ratio.

6. The PLL circuit according to claim 1, wherein said voltage controlled oscillator has a reset terminal for receiving said deadlock detection signal output from said deadlock detection circuit, said voltage controlled oscillator, on receipt of said deadlock detection signal from said deadlock detection circuit, being reset to commence oscillation.

7. The PLL circuit according to claim 1, wherein said counter circuit has a reset terminal for receiving a signal for resetting said counter circuit, said signal being one selected among an inverted version of said up signal, said down signal and the result of logical operation of said up signal and said down signal.

8. The PLL circuit according to claim 1, said deadlock state being detected by determining that, for a predetermined number of clock cycles counted by said counter circuit, said one of said up signal and said down signal is fixed at one of a high level and a low level.

9. The PLL circuit according to claim 8, wherein said deadlock state is caused by at least one of a cessation of oscillation of the voltage controlled oscillator and an unusual increase of an oscillation frequency.

10. The PLL circuit according to claim 1, wherein said deadlock detection circuit further comprises a VCO resetting circuit receiving an output signal from said counter circuit and sending a reset signal to said voltage control oscillator, said VCO resetting circuit comprising a NOR gate receiving as inputs said output signal from said counter circuit and said output signal from said counter circuit as delayed by an odd number of inverters.

11. A PLL circuit comprising:

a phase frequency detector, receiving a reference clock signal and a divided clock signal for comparing phase or frequency of the reference clock signal with phase or frequency of the divided clock signal to output an up signal and a down signal depending on whether the phase of the divided clock signal leads and lags the phase of the reference clock signal, respectively, or on whether the frequency of the divided clock signal is lower and higher than the frequency of the reference clock signal, respectively;

a charge pump circuit, receiving the up and down signals, for causing current to flow out to an output thereof and to flow in from the output thereof, responsive to said up signal and to said down signal, respectively, for outputting an error signal associated with phase or frequency difference detected by said phase frequency detector;

a low-pass filter, receiving the error signal, for smoothing the error signal to output a control voltage;

a voltage controlled oscillator, receiving the control voltage for generating an output clock signal, the frequency of which is controlled to vary to a higher or lower value in accordance with higher or lower level of said control signal, respectively;

a divider circuit, receiving the output clock signal, for dividing the frequency of the output clock signal by a preset frequency division ratio to output said divided clock signal; and a deadlock detection circuit for detecting falling of the PLL circuit into a deadlock state to output a deadlock detection signal;

said deadlock detection circuit including a counter circuit for counting a clock signal, said counter circuit being supplied with an inverted version of one of said up signal and said down signal as a resetting signal, said deadlock state being removed responsive to a signal output from said counter circuit when said counter circuit has counted a preset number of said clock signal.

12. The PLL circuit according to claim 11, further comprising a pulse cutting circuit for cutting one of said up signal and said down signal having a pulse width not larger than a preset width;

said counter circuit being reset responsive to an output signal of said pulse cutting circuit.

13. The PLL circuit according to claim 12, said pulse cutting circuit comprising an OR gate receiving as inputs an inverse of said one of said up signal and said down signal and said inverse of said one of said up signal and said down signal as delayed by a preset delay.

14. The PLL circuit according to claim 11, wherein said clock signal which said counter circuit counts is said reference clock signal or a signal obtained on frequency division of said reference clock signal by a preset frequency division ratio.

15. The PLL circuit according to claim 11, said deadlock state being detected by determining that, for a predetermined number of clock cycles counted by said counter circuit, said one of said up signal and said down signal is fixed at one of a high level and a low level.

16. The PLL circuit according to claim 15, wherein said deadlock state is caused by at least one of a cessation of oscillation of the voltage controlled oscillator and an unusual increase of an oscillation frequency.

17. The PLL circuit according to claim 11, wherein said deadlock detection circuit further comprises a VCO resetting circuit receiving an output signal from said counter circuit and sending a reset signal to said voltage controlled oscillator, said VCO resetting circuit comprising a NOR gate receiving as inputs said output signal from said counter circuit and said output signal from said counter circuit as delayed by an odd number of inverters.

* * * * *